United States Patent [19]
Webb

[11] Patent Number: 6,104,735
[45] Date of Patent: Aug. 15, 2000

[54] GAS DISCHARGE LASER WITH MAGNETIC BEARINGS AND MAGNETIC RELUCTANCE CENTERING FOR FAN DRIVE ASSEMBLY

[75] Inventor: R. Kyle Webb, Escondido, Calif.

[73] Assignee: Cymer, Inc., San Diego, Calif.

[21] Appl. No.: 09/290,851

[22] Filed: Apr. 13, 1999

[51] Int. Cl.[7] .................................................. H01S 3/00
[52] U.S. Cl. ................................ 372/37; 372/57; 372/59; 372/61; 372/65
[58] Field of Search ................................ 372/57, 61, 37, 372/59, 65

[56] References Cited

U.S. PATENT DOCUMENTS 5,848,089  12/1998  Sarkar et al. ............................ 372/57

*Primary Examiner*—Leon Scott, Jr.
*Attorney, Agent, or Firm*—John R. Ross, Esq.

[57] ABSTRACT

The present invention provides an electric discharge gas laser having a laser cavity in which is contained a laser gas and a fan for circulating the laser gas. The fan is supported by an active radial magnetic bearing system and driven by a brushless DC motor in which the rotor of the motor and the rotors of at least two radial bearings are sealed within the gas environment of the laser cavity and the motor stator and the coils of the bearing magnets are located outside the gas environment. No thrust bearing is provided. Axial positioning of the shaft is provided by reluctance centering produced by the at least two radial magnetic bearings and the brushless DC motor. In a preferred embodiment the motor stator is larger in the axial direction than the rotor to increase the magnetic centering effect.

6 Claims, 7 Drawing Sheets

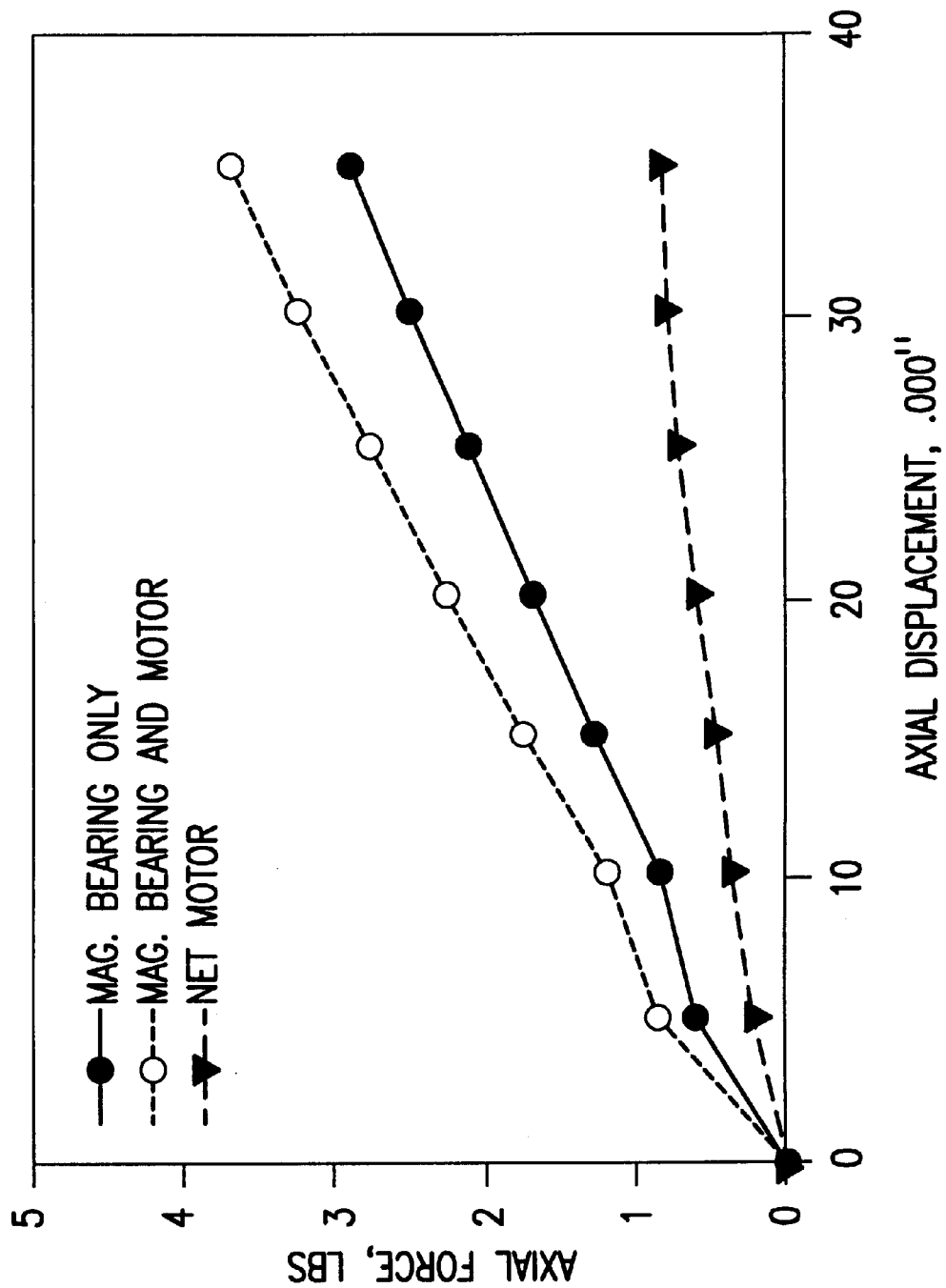

GAS DISCHARGE LASER WITH MAGNETIC BEARINGS AND MAGNETIC RELUCTANCE CENTERING FOR FAN DRIVE ASSEMBLY

This invention relates to gas lasers and, in particular, to high repetition rate electric discharge gas lasers.

BACKGROUND OF THE INVENTION

Electric Discharge Gas Lasers

Electric discharge gas lasers are well known and have been available since soon after lasers were invented in the 1960s. A high voltage discharge between two electrodes excites a gaseous gain medium. A resonance cavity containing the gain medium permit stimulated amplification of light which is then extracted from the cavity in the form of a laser beam. These electric discharge gas lasers may be operated in a continuous or pulse mode.

Excimer Lasers

Excimer lasers are a particular type of electric gas discharge laser and have been known as such since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicant's employer, and the patent is hereby incorporated herein by reference. The excimer laser described in Patent '884 is a high repetition rate pulse laser. The principal elements of the laser 10 are shown in FIG. 1 which correspond to FIG. 1 in Patent '884. The discharges 22 are between two long (about 23 inches) electrodes 18 and 20 spaced apart by about 5/8 inch. Repetition rates of prior art lasers, like the one described, are typically within the range of about 100 to 1000 pulses per second. These high repetition rate lasers are usually provided with a gas circulation system which replaces the gas in the region between the electrodes between each pulse. In the above referred to laser, this is done with a long squirrel-cage type fan 46, having blades 48 as shown in FIG. 1 and FIG. 2 which is FIG. 7 in Patent '884. The fan is slightly longer than the electrodes 18 and 20 and provides sufficient circulation so that at pulse rates between 100 to 1000 Hz, the gas between the electrodes is cleared between pulses. The shaft 130 of fan 46 is supported by two bearings 132 as shown in FIG. 3 which is FIG. 9 of Patent '884. The gas used in the laser contains fluorine which is extremely reactive. The fan rotor driving fan shaft 130 is sealed, within the same environmental system provided by housing structure members 12 and 14, by sealing member 136 as explained at column 9, line 45 of Patent '884, and the motor stator 140 is outside sealing member 136 and thus protected from the corrosive action of the fluorine gas. However, bearing 132 is subjected to the corrosive action of the chamber gas as is any lubrication used in the bearing. Corrosion of bearings and bearing lubrication can contaminate the gas.

Magnetic Bearings

Active magnetic bearings have been well known for many years. Such systems were built as early as 1938, and they are used in many industrial applications today. Known advantages of these bearings include long life, reduced maintenance and small bearing losses, and no lubrication is required which eliminates a source of contamination.

A typical prior art active radial bearing is described in FIG. 4. Sensor 2 senses the position of soft iron rotor 4 and sends a signal to controller 6 which controls the current in electromagnet 8 with power amplifier 10 in order to produce the precise magnetic field needed to balance rotor 4 in a desired position.

U.S. Pat. No. 5,848,089 assigned to Applicant's employer, discloses a gas discharge laser with active magnetic bearings providing both radial and axial support. Applicant and his fellow workers have demonstrated successful performance with laser assemblies utilizing the teachings of that patent; however, providing both radial and axial bearings with associated active controls is expensive.

What is Needed

A need exists to reduce costs of magnetic bearing systems for gas discharge lasers.

SUMMARY OF THE INVENTION

The present invention provides an electric discharge gas laser having a laser cavity in which is contained a laser gas and a fan for circulating the laser gas. The fan is supported by an active radial magnetic bearing system and driven by a brushless DC motor in which the rotor of the motor and the rotors of at least two radial bearings are sealed within the gas environment of the laser cavity and the motor stator and the coils of the bearing magnets are located outside the gas environment. No thrust bearing is provided. Axial positioning of the shaft is provided by reluctance centering produced by the at least two radial magnetic bearings and the brushless DC motor. In a preferred embodiment the motor stator is larger in the axial direction than the rotor to increase the magnetic centering effect.

BRIEF DESCRIPTION OF THE DRAWINGS

FIG. 7 is a chart of test data showing the practicality of reluctance centering.

DETAILED DESCRIPTION OF PREFERRED EMBODIMENT

Preferred embodiments of the present invention can be described by reference to the drawings.

Figure 1:
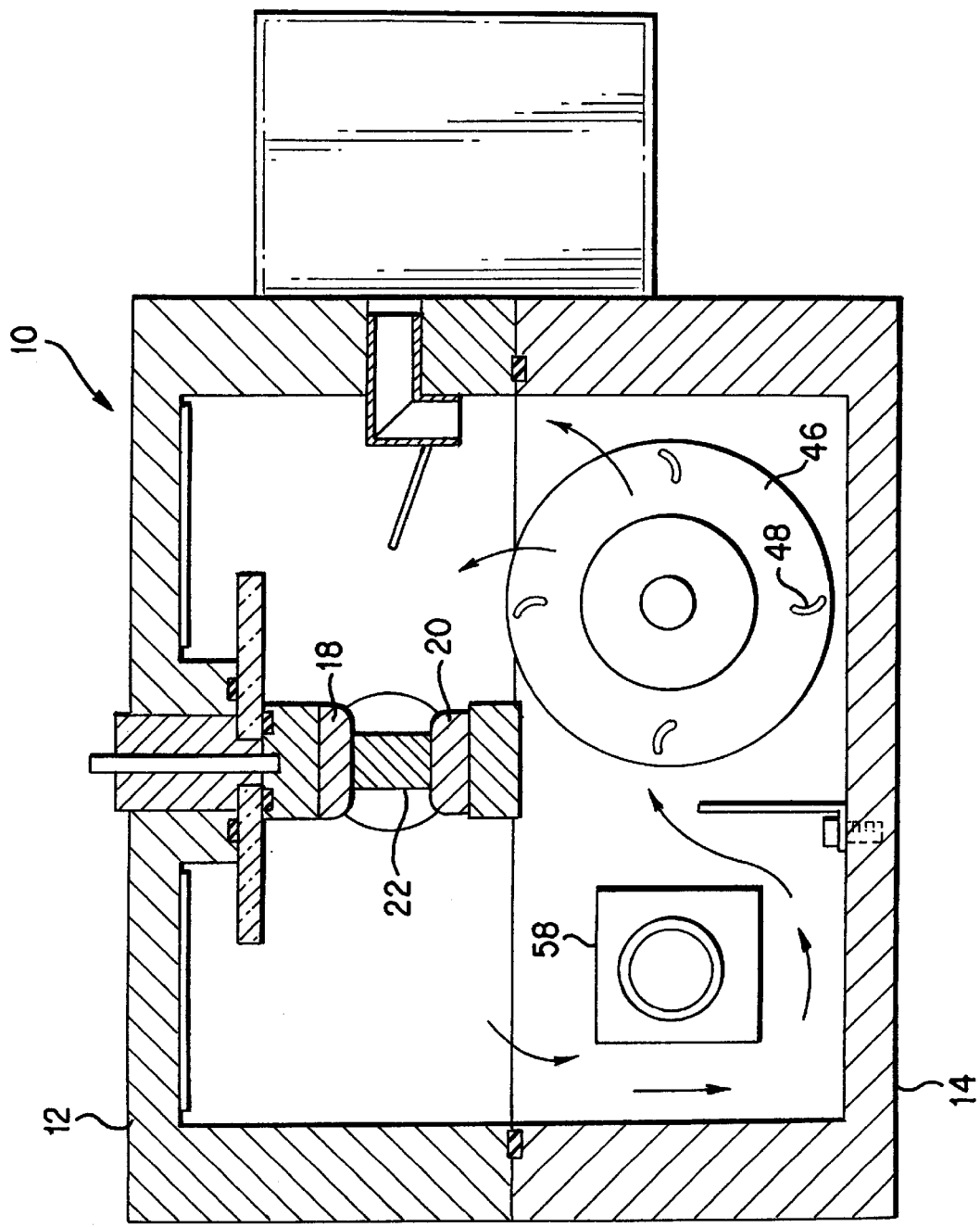
FIG. 1 shows a prior art laser system.
Figure 2:
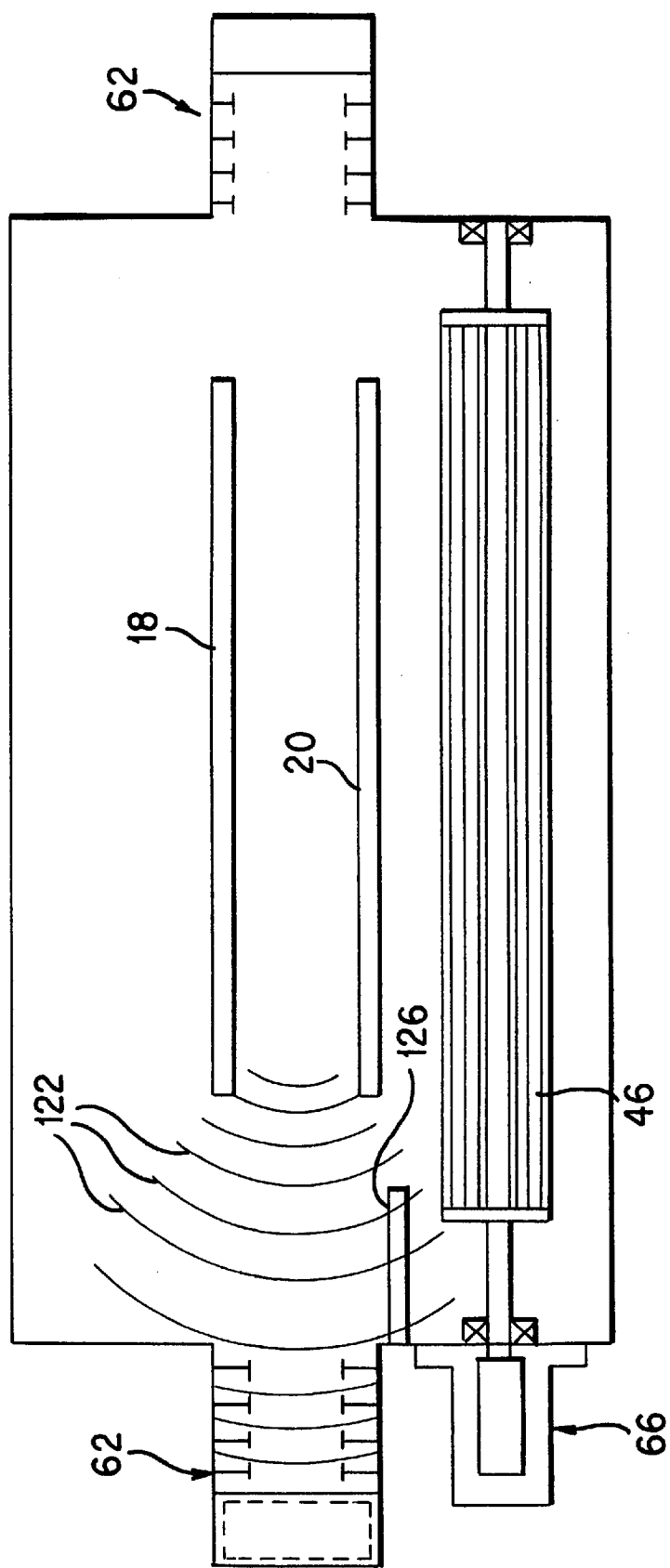
FIG. 2 shows the location of a squirrel cage fan in the FIG. 1 laser.
Figure 3:
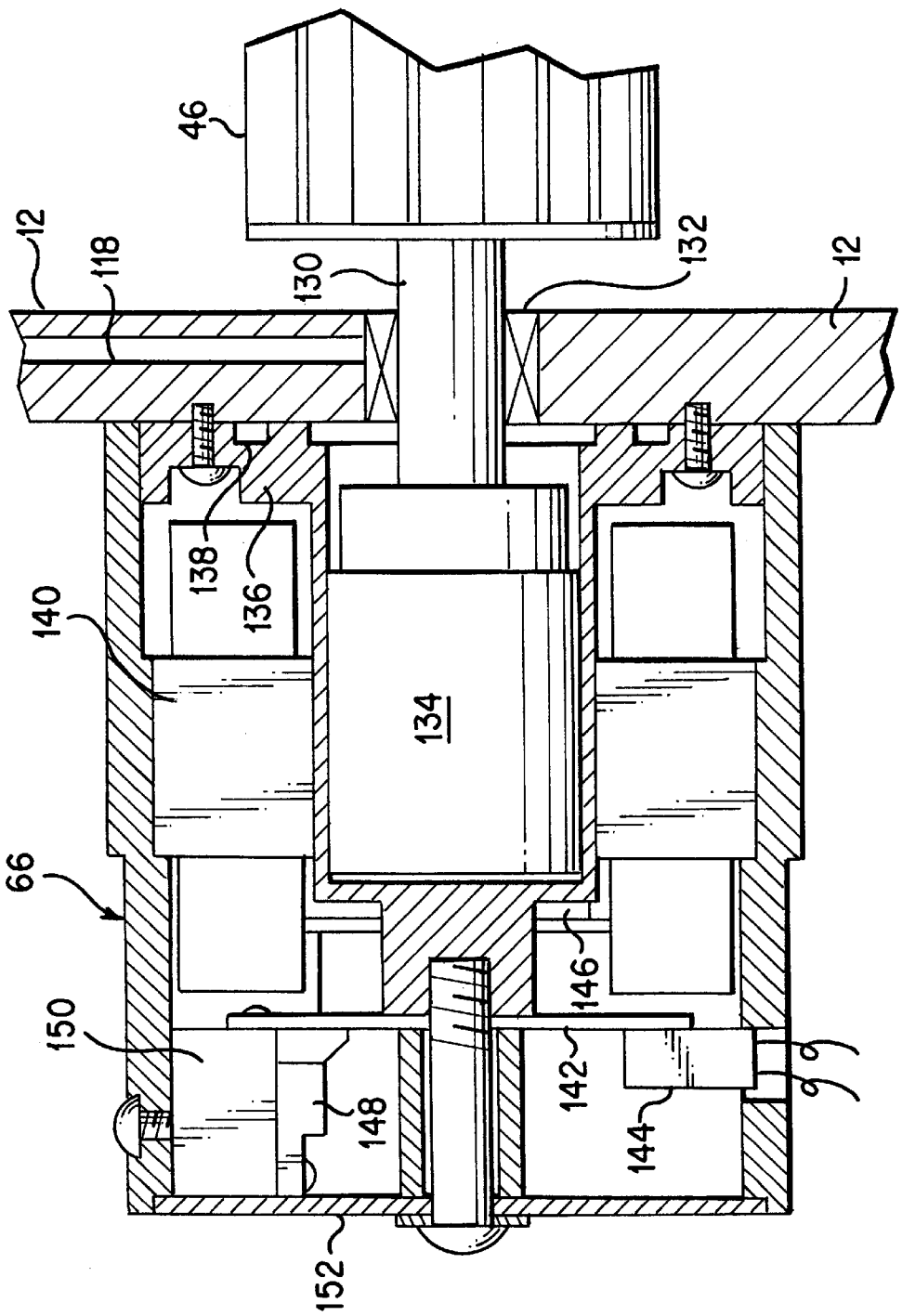
FIG. 3 shows a prior art brushless DC motor for driving the fan.
Figure 4:
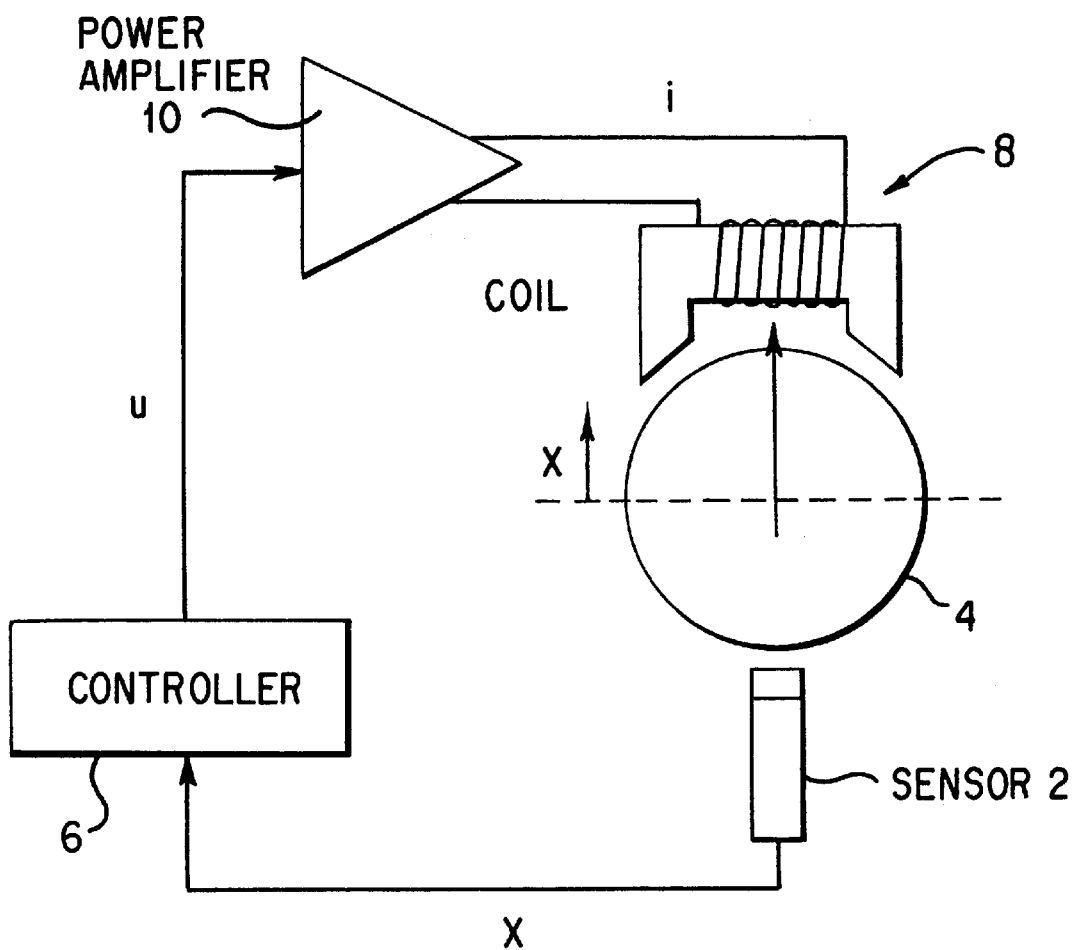
FIG. 4 demonstrates the functioning of a prior art active radial magnetic bearing system.
Figure 5:
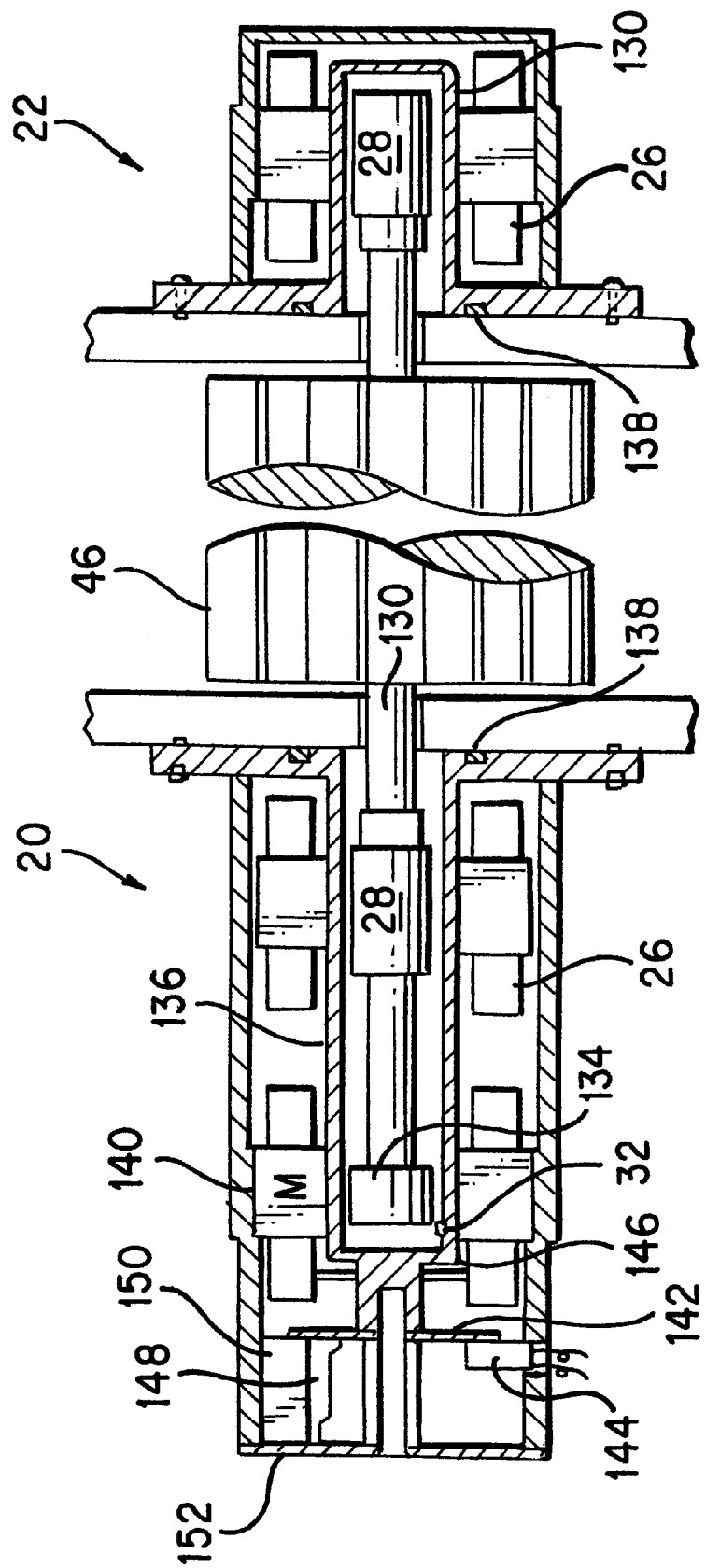
FIG. 5 is a drawing of a preferred embodiment of the present invention.

FIG. 5 is a drawing showing important features of a preferred embodiment of the present invention. This drawing shows a fan system for gas circulation of an excimer laser of the type described in detail in U.S. Patent '884. This gas is comprised of fluorine, a buffer gas, neon, and a noble gas which could be either krypton or argon. As in the prior art unit, rotor 134 is located on the end of shaft 130, with rotor 134 driving shaft 130, and thereby 26-inch fan 46, the central portion of which has been sectioned out in FIG. 5. Surrounding the end of rotor 134 and sealing member 136 is stator 140 which is a series of windings. The stator 140 and rotor 134 together form a brushless DC motor which operates basically in the normal manner. The major difference between a normal brushless DC motor and this motor is the use of sealing member 136 located between the stator and the rotor so that the rotor is sealed relative to the stator 140. This arrangement permits the DC motor to drive fan 46 without the use of a rotating seal in the same manner as described in Patent '884. The motor also includes circuit board 142, power input connection 144, and a Hall detector 146 as explained in Patent '884.

Figure 6:
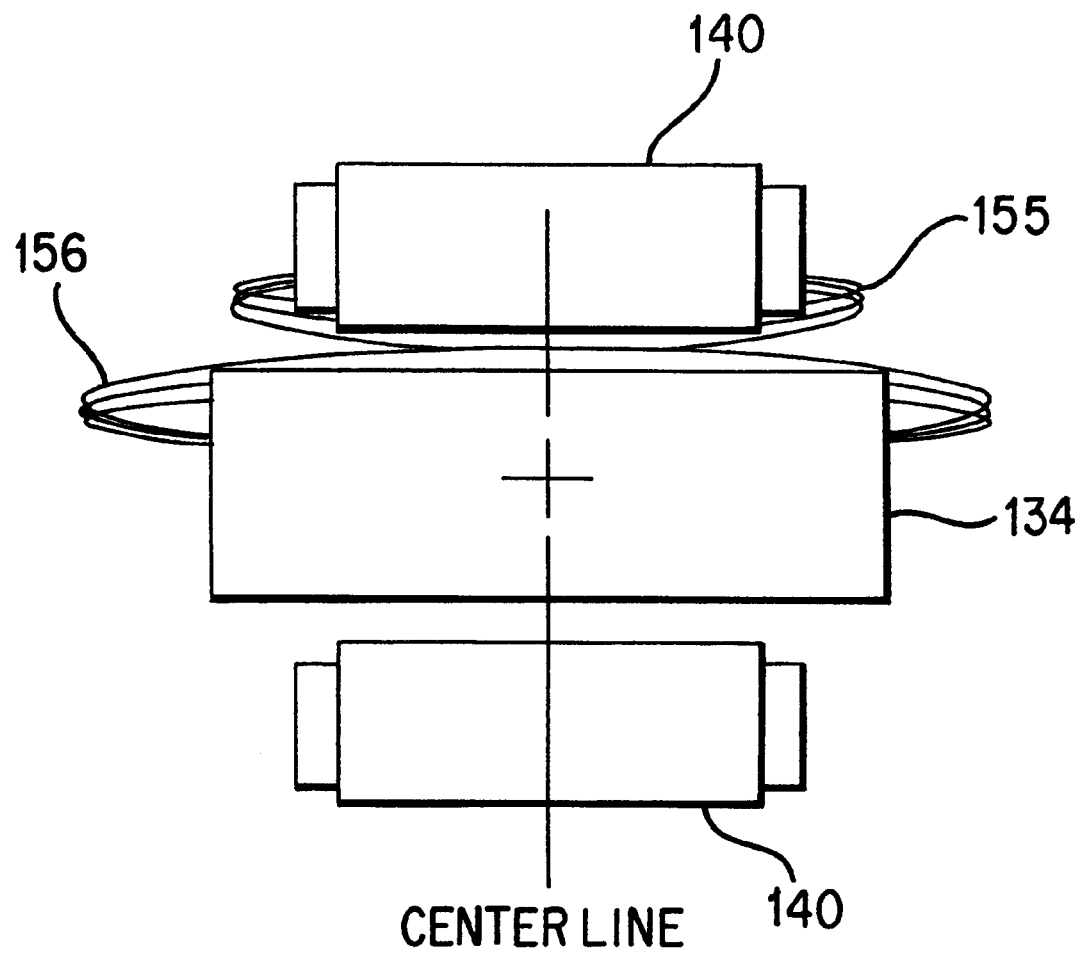
FIG. 6 is a drawing demonstrating reluctance centering.

This embodiment of the present invention includes two radial magnetic bearings 20 and 22 supporting each end of shaft 130 of fan 46. The axial positioning of shaft 130 is provided by magnetic reluctance centering of rotor 134 by stator 140. Field lines responsible for this reluctance centering are shown in FIG. 6. Radial bearings 20 and 22 each consist of four electromagnets 26 (two of which are shown in FIG. 5). Preferably the electromagnets are positioned at radial positions of 45°, 135°, 225° and 315°. The rotor 28 and stator elements are made of soft laminated iron. In fact, the electromagnets are very similar to the brushless DC motor discussed above. However, the function of the electromagnets is to hold the fan shaft in its proper radial position rather than rotate it. The electromagnets are preferably energized with a constant bias current (about half the maximum current which is symmetrically perturbed by a control current to produce dynamic control force). The fixed bias current provides a linearization of the magnetic forces produced by the bearings. Radial position sensors 32, 90° apart, aligned with the electromagnets provide position information to a control unit (not shown) which controls the current to the electromagnets in accordance with well known techniques.

The rotor cavities at both ends of the fan shaft 130 are sealed by sealing members 130 and 136 and O-ring seals 138. Thus, the windings of motor unit 140 and electromagnets in bearings 20 and 22 are protected from the corrosive fluorine gas in the laser chamber.

In this preferred embodiment, the fan is a 26" long axial monolithic fan made from 9 identical cylindrical (hollow) segments of 2.3" long. Each segment is made of two rings/flanges with 3.75" OD and 2.75" ID. Between these rings lies 23 vanes/blades around 360°. The vanes are 2.3" long, 0.5" wide (curved) and 0.03" thick. The fan is made with aluminum alloy and weighs 1.5 lbs. Final weight for other considerations may go up to 2.0 lbs. or more. The preferred speed of the fan is 3300 RPM to 5000 RPM.

The fan operates at speeds of 3000 RPM to 5000 RPM in a laser gas environment with a fluorine content of about 0.1% at temperatures of about 60° C. With these bearings, the inventors expect at least 30,000 hours of trouble-free operation with a 95% confidence level and 10,000 hours of operation with a 99% confidence level.

The primary advantages of the present invention over the system described in the specification of U.S. Pat. No. 5,848,089 is that no axial bearing is needed. The axial positioning is provided by the reluctance centering produced by the two radial magnetic bearings and the brushless DC motor. FIG. 6 shows stator field lines 155 and rotor field lines 156 which force the rotor magnetic center to line axially up with the stator magnetic center. The reluctance centering effect can be increased by making either the rotor axially longer than its corresponding stator in both the magnets and the DC motor. A similar effect can be achieved by making the stators longer axially than the rotors.

Prior art blowers typically operate at a constant speed such as 3800 RPM. The present invention will operate at speeds up to 5000 RPM or greater. In a preferred operating mode, the speed is continuously or periodically automatically cycled, for example, from 4000 RPM to 5000 RPM, in order to provide better mixing of the chamber gas. Automatic cycling of fan speed may also be utilized to avoid buildup of oscillations in the long fan.

The speed of the fan can also be controlled, if necessary, from the information sent by a strategically located sensor to the controller. This is helpful if and when the rotating fan parts come too close to the parts of other components in the chamber. Although there are many other reasons to control and/or vary the speed of the fan, the one to reduce/control the effects of acoustic and/or shock waves are of significant importance in laser operations.

Test Results

Applicant has conducted actual tests with a prototype blower unit as described in FIG. 5 in order to prove the practicality of reluctance centering. A sample of his test data is set forth in the following table:

| Column 1 Displacement Inches | Column 2 Mag Bearing ONLY Lbs | Column 3 Mag Bearing And Motor Lbs | Column 4 Net Motor Lbs |
| --- | --- | --- | --- |
| 0.000 | 0.00 | 0.00 | 0.00 |
| 0.005 | 0.61 | 0.82 | 0.21 |
| 0.010 | 0.84 | 1.16 | 0.32 |
| 0.015 | 1.28 | 1.71 | 0.43 |
| 0.020 | 1.65 | 2.20 | 0.55 |
| 0.025 | 2/05 | 2.27 | 0.67 |
| 0.030 | 2.45 | 3.16 | 0.71 |
| 0.035 | 2.81 | 3.58 | 0.77 |

Column 1 is a measurement of the displacement from the shaft axial reluctance center position. Column 2 is the force needed to move the shaft a distance corresponding to the corresponding displacement value in Column 1 with the DC motor turned off. Column 3 is the same as Column 2 but with the motor rotating the fan at 5000 RPM. Column 4 represents the difference between Column 2 and 3 or the reluctance centering effects of the motor alone. The data are plotted in FIG. 7.

While the invention has been described in connection with what is presently considered to be the preferred embodiments, it is to be understood that the invention is not limited to the disclosed embodiments, but on the contrary, covers various modifications and equivalents included within the spirit and scope of the following claims. For example, we have shown only one example of radial active magnetic bearings. Many alternate magnetic bearing designs are well known and can be adopted to gas discharge lasers using the concept disclosed herein. In many embodiments, the provision of sit down bearings may be provided to avoid damage or wear from unexpected large axial or radial forces. The blower drive unit described is especially useful as a drive for KrF and ArF lasers and $F_2$ lasers. Therefore, persons of ordinary skill in this field are to understand that all such equivalents are included within the scope of the claims.

What is claimed is:

1. An electric discharge gas laser comprising:
   A. a housing structure having walls forming an internal laser cavity;
   B. a gas located within the laser cavity to define a gas environment, said gas being capable of lasing action;
   C. a pair of elongated spaced apart electrodes located within the laser cavity and forming an electrical discharge region between the electrodes for stimulating gas within the discharge region to lasing action in accordance with an electrical discharge between the electrodes;

D. a rotating fan having a shaft and located within the laser cavity for circulating the gas through the discharge region;

E. a brushless DC motor comprising a stator and a rotor for providing rotation and axial positioning of the fan assembly with magnetic reluctance centering to thereby maintain the shaft in a desired axial position;

F. at least two radial magnetic bearings, each comprising a stator and a rotor and position sensors for providing radial support to said shaft;

G. said rotors of said motor and said at least two magnetic bearings, each being coupled to said shaft; and H. at least one sealing member sealed to the housing structure and interposed between at least one of said rotors and its respective stator to enclose said at least one rotor within said sealing member to seal said at least one rotor within the gas environment and to seal its respective stator outside the gas environment;

wherein said shaft is supported radially by said radial magnetic bearings and positioned axially with said magnetic reluctance centering provided by said DC motor.

2. A laser as in claim 1 and further comprising an electronic fan control unit providing high speed active control to said radial magnetic bearings.

3. A laser as in claim 1 wherein said gas comprises a halogen and a buffer gas to provide an excimer laser.

4. A laser as in claim 1 wherein said halogen is fluorine, said buffer gas is neon.

5. A laser as in claim 1 wherein said gas further comprises krypton.

6. A laser as in claim 1 wherein said gas further comprises argon.

* * * * *